United States Patent
Tanno et al.

[11] Patent Number: 5,808,525
[45] Date of Patent: Sep. 15, 1998

[54] THIN FILM CHIP OF MAGNETIC OXIDE GARNET AND MAGNETOSTATIC SURFACE WAVE DEVICE THEREWITH

[75] Inventors: Masayuki Tanno; Satoru Fukuda; Yoshiyuki Shiono; Toshihiko Ryuo, all of Gunma-ken, Japan

[73] Assignee: Shin-Etsu Chemical Co., Ltd., Tokyo, Japan

[21] Appl. No.: 690,576

[22] Filed: Jul. 31, 1996

[30] Foreign Application Priority Data

Aug. 2, 1995 [JP] Japan ................................. 7-197438

[51] Int. Cl.⁶ .................................................. H01P 1/215
[52] U.S. Cl. ................................................... 333/201
[58] Field of Search ...................................... 333/201

[56] References Cited

U.S. PATENT DOCUMENTS

| | | | |
|---|---|---|---|
| 4,555,683 | 11/1985 | Sorger et al. | 333/202 |
| 5,601,935 | 2/1997 | Fujino et al. | 333/156 X |

FOREIGN PATENT DOCUMENTS

| | | | |
|---|---|---|---|
| 63-132503(A) | 6/1988 | Japan | 333/24.2 |
| 7-50215(A) | 2/1995 | Japan . | |

*Primary Examiner*—Robert J. Pascal
*Assistant Examiner*—Barbara Summons
*Attorney, Agent, or Firm*—McAulay Nissen Goldberg Kiel & Hand, LLP

[57] ABSTRACT

Proposed is an improvement in a magnetostatic surface wave device such as an S/N enhancer comprising a thin film chip of a magnetic oxide garnet, e.g., gallium-substituted YIG epitaxially grown on the surface of a substrate, e.g., GGG, to which a magnetic field is applied within the plane of the thin film. The low-pass cut-off frequency of the microwaves can be decreased to 400 MHz or lower and the half-value width of magnetic resonance $\Delta H$ can be small enough when the principal plane of the thin film of the magnetic oxide garnet is the (110) plane and the magnetic field applied thereto is in such a direction that the angle between the direction of the magnetic field and the direction of the <100> axis of the thin film within the (110) plane is in the range from ±27° to ±33°.

5 Claims, 9 Drawing Sheets

THIN FILM CHIP OF MAGNETIC OXIDE GARNET AND MAGNETOSTATIC SURFACE WAVE DEVICE THEREWITH

BACKGROUND OF THE INVENTION

The present invention relates to a novel thin-film chip of a magnetic oxide garnet and a magnetostatic surface wave device therewith or, more particularly, to a novel thin-film chip of a magnetic oxide garnet and a magnetostatic surface wave device therewith utilizing the magnetostatic surface waves such as filters, resonators, S/N enhancers and the like working in the microwave range.

As is known, the television broadcasting utilizing an artificial satellite, referred to as the satellite broadcasting hereinafter, has a problem that the electromagnetic waves coming from the artificial satellite are greatly disturbed by an intense rainfall causing appearance of pulsewise noises on the images exhibited on the CRT screen as well as great difficulty in receiving the television waves. With an object to solve this problem, a proposal has been made by T. Nomoto, et al. in IEEE Transactions on Microwave Theory and Techniques, volume 41, No. 8 (August 1993), pages 1316–1322, for the use of an S/N enhancer by which degradation of the CRT images can be prevented even in an adverse meteorological environment.

While the above mentioned S/N enhancer is constructed by using two magnetostatic surface wave filters, an adapter of the television receiver set for satellite broadcasting has been developed in recent years as is reported by Y. Ishikawa, et al. in Proceedings of 1994 Asian-Pacific Conference, pages 179–183, in which, with an object to obtain compatibility of the S/N enhancer working at a frequency of 1.9 GHz with the signals at a frequency band of 1.1 to 1.3 GHz, which is the first intermediate frequency band used in the television receiver sets for the satellite broadcasting, the received signals at the first intermediate frequency of the television receiver set for satellite broadcasting are subjected to frequency conversion into the frequency of 1.9 GHz to effect reduction of the noises by the S/N enhancer and the signals with the thus reduced noises are used after frequency conversion into 1 to 1.3 GHz. This means, however, is not quite satisfactory when an inexpensive receiver adapter is desired because various auxiliary circuits must be added besides the S/N enhancer.

Accordingly, it is eagerly desired to develop an S/N enhancer capable of working at a frequency band of 1 to 1.3 GHz or working at a frequency band of 400 MHz which is the second intermediate frequency band in the television receiver sets for the satellite broadcasting.

The devices having the above described particular working characteristics can be realized only with development of a device utilizing magnetostatic surface waves capable of working at a still lower frequency. For example, Japanese Patent Kokai 7-130539 proposes a magnetostatic surface wave device which is an epitaxial single crystal film of a rare earth-based oxide garnet containing the element of iron grown on the surface of a single crystal substrate of gadolinium gallium garnet having a chemical composition of the formula $Gd_3Ga_5O_{12}$, referred to as GGG hereinafter, the crystallographic orientation of the substrate surface being on either one of the (110), (100) and (211) planes, because such a magnetostatic surface wave device is capable of working at a relatively small anisotropic magnetic field to decrease the lowest frequency in the propagation band of the magnetostatic surface waves.

The above mentioned Japanese patent document gives examples in which the anisotropic magnetic fields are 30 G, 20 G and 30 G within the crystallographic planes of (110), (100) and (211), respectively, when the saturation magnetization is 1760 G to be small as compared with the value of 60 G within the (111) plane when the saturation magnetization is also 1760 G so that the lowest frequency in the propagation band can be reduced.

A problem here is that the anisotropic magnetic field is subject to variation within a wide temperature range including room temperature due to the large temperature dependence thereof along with a further problem that the single crystal garnet film can hardly be applied to a magnetostatic surface wave device working at a frequency of 400 MHz because the lowest frequency of the magnetostatic surface waves within the propagation band as exemplified is 900 MHz or higher for the (100) plane with the saturation magnetization of 1760 G.

Under the above described situations, on the other hand, a report is given of an S/N enhancer working at a frequency of 400 MHz in Preprints of General Meeting of Electronic Information and Communication Society, 1995, C-111, according to which the working frequency of the S/N enhancer can be decreased to 400 MHz by selecting a thin film of YIG (yttrium iron garnet) having a small saturation magnetization. This S/N enhancer, however, has several problems that the range of the working frequency is only 40 MHz and the working frequency is subject to variation depending on the ambient temperature along with a large half-value width of magnetic resonance ΔH with the small saturation magnetization to cause a difficulty in the oscillation of the magnetostatic surface waves with an extremely narrow frequency range.

SUMMARY OF THE INVENTION

The present invention accordingly has an object, in order to solve the above described problems in the prior art, to provide a chip with a thin film of a magnetic oxide garnet suitable for use as an element in a filter, resonator and S/N enhancer in the microwave band by utilizing magnetostatic surface waves as well as to provide a magnetostatic surface wave device by utilizing the same.

Thus, the chip provided by the invention has a thin film of a magnetic oxide garnet having at least one end facet as cut in a plane perpendicular to the direction deviated by an angle in the range from ±27° to ±33° from the direction of the crystallographic <100> axis within the crystallographic (110) plane of the magnetic oxide garnet film.

The invention further provides an improvement, in a magnetostatic surface wave device having a thin film of a magnetic oxide garnet to which a magnetic field is applied within the plane thereof, which comprises that the direction of the magnetic field deviates from the direction of the crystallographic <100> axis within the crystallographic (110) plane of the magnetic oxide garnet film by an angle in the range from ±27° to ±33°

DETAILED DESCRIPTION OF THE PREFERRED EMBODIMENTS

Figure 1:
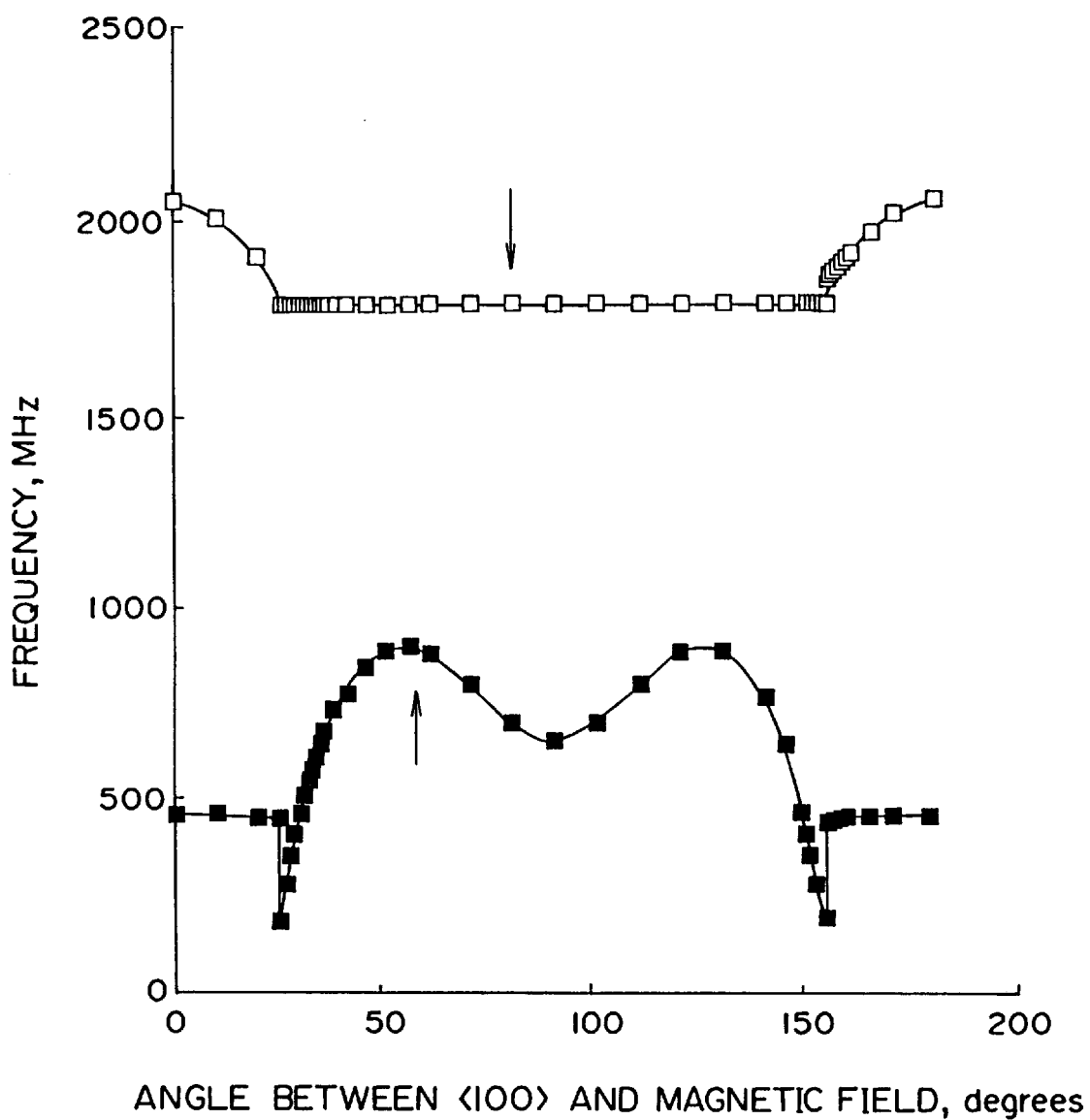
FIG. 1 is a graph showing the low-pass and high-pass cut-off frequencies of the magnetostatic surface waves (MSSW) formed by a thin film of gallium-substituted YIG, of which the principal plane is the crystallographic (110) plane and the saturation magnetization is 1200 G, as a function of the angle between the direction of the <100> axis and the direction of the magnetic field.

As a result of the extensive investigations, the inventors have unexpectedly arrived at a discovery that the above described problems and disadvantages in a magnetostatic surface wave device, in which a magnetic field is applied within the plane of the thin film of a magnetic oxide garnet, can be overcome when the, direction of the magnetic field deviates from the direction of the crystallographic <100> axis within the crystallographic (110) plane of the magnetic oxide garnet film by an angle in the range from ±27° to ±33°.

It has been further discovered that the above mentioned desirable condition can be readily accomplished when the magnetostatic surface wave device comprises a substrate of, for example, GGG and a epitaxial film grown on the surface of the substrate having a crystallographic orientation of (110) by the liquid-phase epitaxial method and having a chemical composition expressed by the formula $R_3(Fe,M)_5O_{12}$, in which R is an element or a combination of elements selected from the group consisting of bismuth, yttrium, lanthanum, lutetium and gadolinium and M is an element or a combination of elements selected from the group consisting of gallium, aluminum and scandium, and when the direction of the magnetic field applied to the magnetic oxide garnet film deviates from the direction of the crystallographic <100> axis within the crystallographic (110) plane of the magnetic oxide garnet film by an angle in the range from ±27° to ±33°.

The inventors have continued their development works with an object to provide a magnetostatic surface wave device in which the low-pass cut-off frequency of the magnetostatic surface waves, referred to as MSSWs hereinafter, can be decreased as low as possible so as to enable working of the MSSW device at a frequency of 400 MHz and the working frequency range can be expanded so as to ensure a working frequency range even under variation of the ambient temperature and also to keep a small half-value width of magnetic resonance $\Delta H$ of the thin film of YIG leading to an attempt to undertake both theoretical and experimental detailed studies on the crystallographic orientation of a magnetic oxide garnet film for MSSW devices and the direction of application of the magnetic field to drive the MSSW device.

Their studies in this regard were started with a conventional S/N enhancer. While the MSSW device used in an S/N enhancer utilizes the MSSWs among the three modes of the MSSWs, the frequency range in which the MSSWs can exist is defined by the lower limit of the frequency $f_{min}$ and the upper limit of the frequency $f_{max}$ which are respectively expressed, when the anisotropic magnetic field of the crystal is taken into account, by the following equations:

$$f_{min} = \gamma \sqrt{(Hex + HK)(Hex + HK + 4\pi Ms)} \quad ; \quad (1)$$

and $$f_{max} = \gamma(Hex + HK + 4\pi Ms/2), \quad (2)$$

in which $\gamma$ is the rotating magnetic ratio (2.8 MHz/Oe), Hex is the external magnetic field, $4\pi Ms$ is the saturation magnetization of the YIG thin film and HK is the anisotropic magnetic field of the crystal given by the equation $$HK = [2.0 - (5/2)\cdot\sin^2\theta - (15/8)\cdot\sin^2(2\theta)]\cdot K1/Ms, \quad (3)$$

K1 being the anisotropy constant of the primary cubic crystal and $\theta$ being the angle between the direction of the magnetic field and the direction of the <100> axis within the (110) plane.

Figure 8:
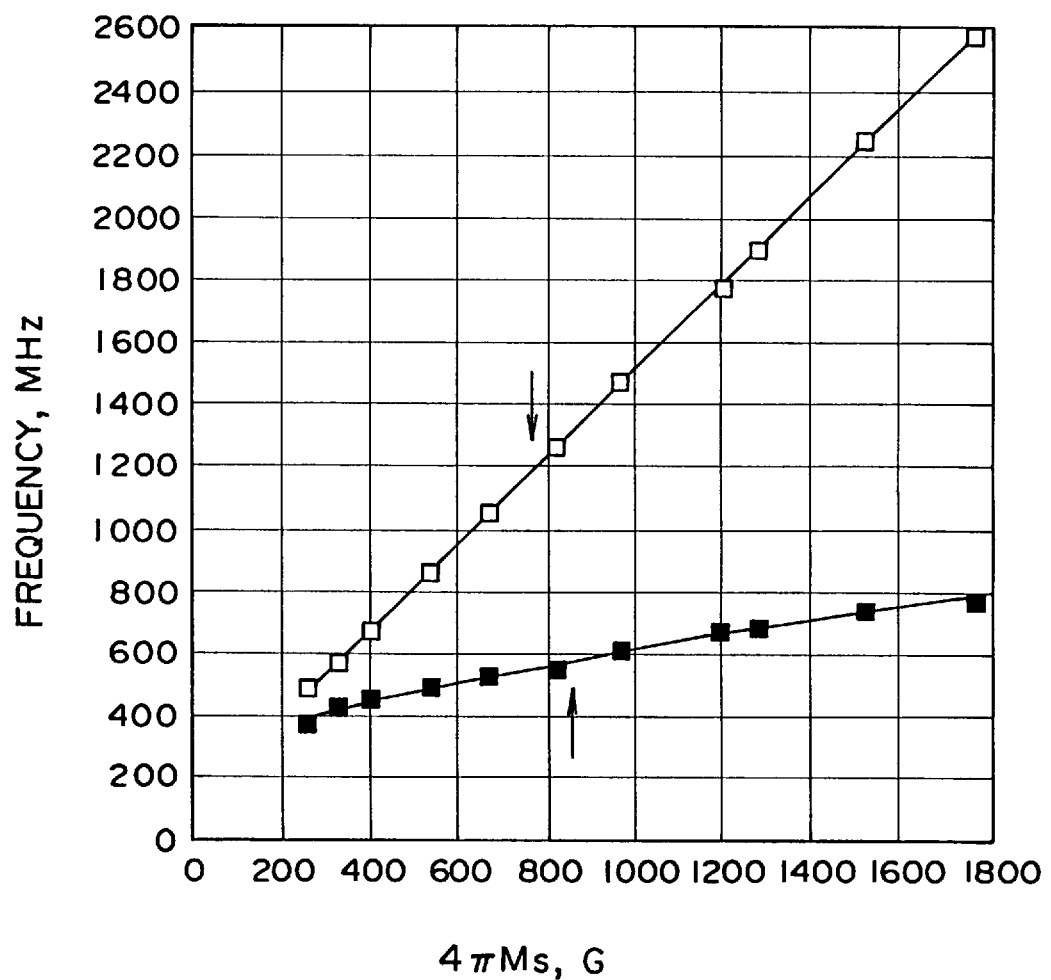
FIG. 8 is a graph showing the frequency range of the MSSWs in a thin film of gallium-substituted YIG having a crystallographic orientation of (111) as a function of the saturation magnetization $4\pi Ms$.

The above given equations (1) and (2) were applied to the calculation of the lower and upper limits of the frequency range for the MSSWs of a thin film of gallium-substituted YIG having a crystallographic orientation of (111) as in conventional YIG films as a function of the saturation magnetization $4\pi Ms$ assuming conditions including an ambient temperature of 20° C. and an external magnetic field Hex of 20 G to give the results shown in FIG. 8 by the two curves for the upper limit (plot with open squares) and lower limit (plot with filled squares). It is understood from these results that a working range in the 400 MHz band can be ensured only with a small saturation magnetization not exceeding about 400 G while the band width of the satellite broadcasting is 27 MHz per channel.

Figure 9:
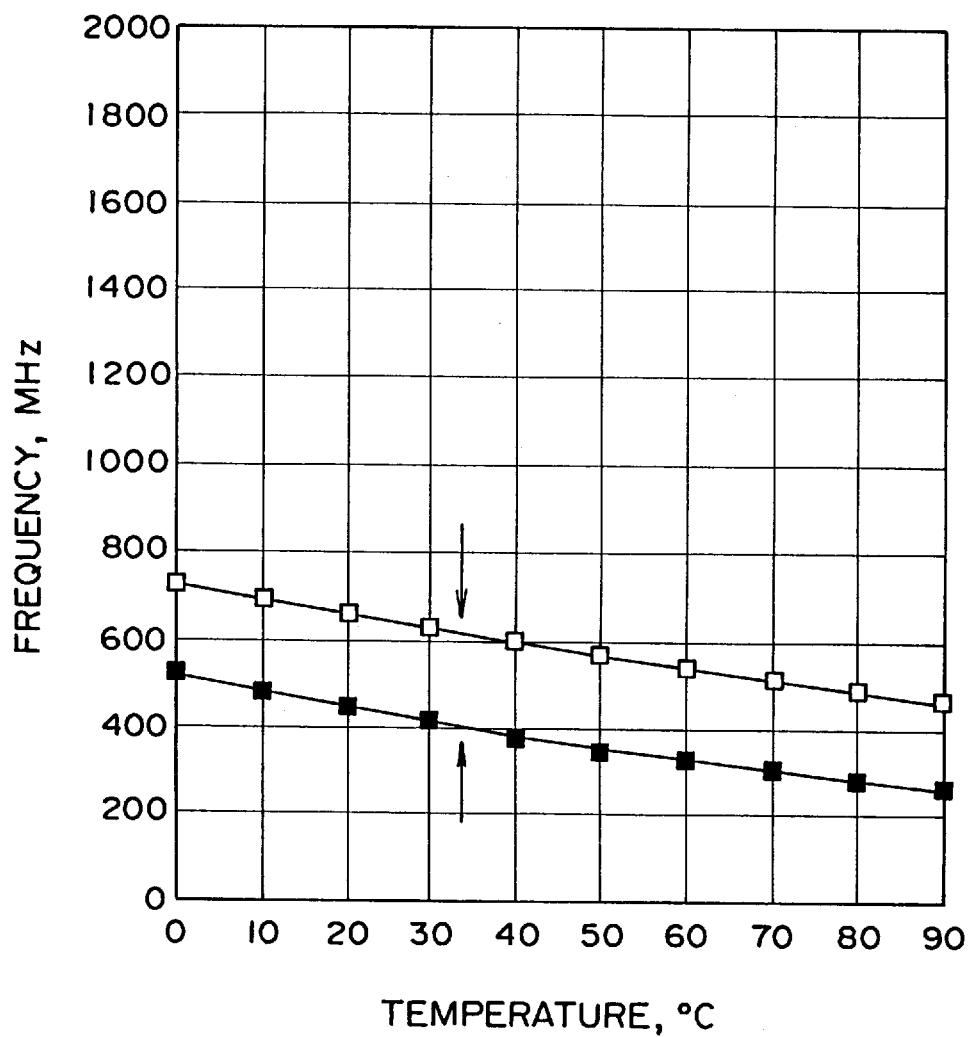
FIGS. 9 and 10 are each a graph showing the frequency range for the MSSWs in a thin film of gallium-substituted YIG having a crystallographic orientation of (111) and a saturation magnetization of 340 G and 1200 G, respectively, as a function of temperature.

Further, FIG. 9 shows the frequency range for the existence of the MSSWs in a YIG thin film of the crystallographic orientation of (111) having a saturation magnetization of 340 G as a function of the ambient temperature. It is known that the frequency range for the existence of MSSWs varies depending on the temperature and a frequency range of 27 MHz can be obtained in the vicinity of 400 MHz only within a narrow temperature range. In addition, a difficult problem is encountered with a YIG having a small saturation magnetization of 400 G or smaller that rapid degradation is caused in the half-value width of magnetic resonance $\Delta H$ as compared with a thin film of conventional pure YIG so that the MSSWs can hardly be driven.

With an object to solve the above described problems, the inventors have undertaken a theoretical study for the YIG thin films having different saturation magnetizations on the relationship between the frequency range for the MSSWs defined by the low-pass cut-off frequency and the high-pass cut-off frequency and the deviation angle $\theta$ of the direction of the magnetic field applied to the thin film of a gallium-substituted YIG of which the principal plane is (110) from the direction of the crystallographic <100> axis within the (110) plane of the YIG thin film to give the results shown in FIG. 1.

Namely, FIG. 1 is a graphical showing of the results obtained by the calculation using the equations (1) and (2) given above on the frequency range for the existence of MSSWs in a thin film of a gallium-substituted YIG of which the saturation magnetization is 1200 G at room temperature as a function of the angle θ between the direction of the magnetic field and the direction of the crystallographic <100> axis within the (110) plane. FIG. 1 shows that two dips, at which the low-pass cut-off frequency can be 400 MHz or lower, are found at angles θ of +28° and +152° which is equivalent to −28°.

Figure 2:
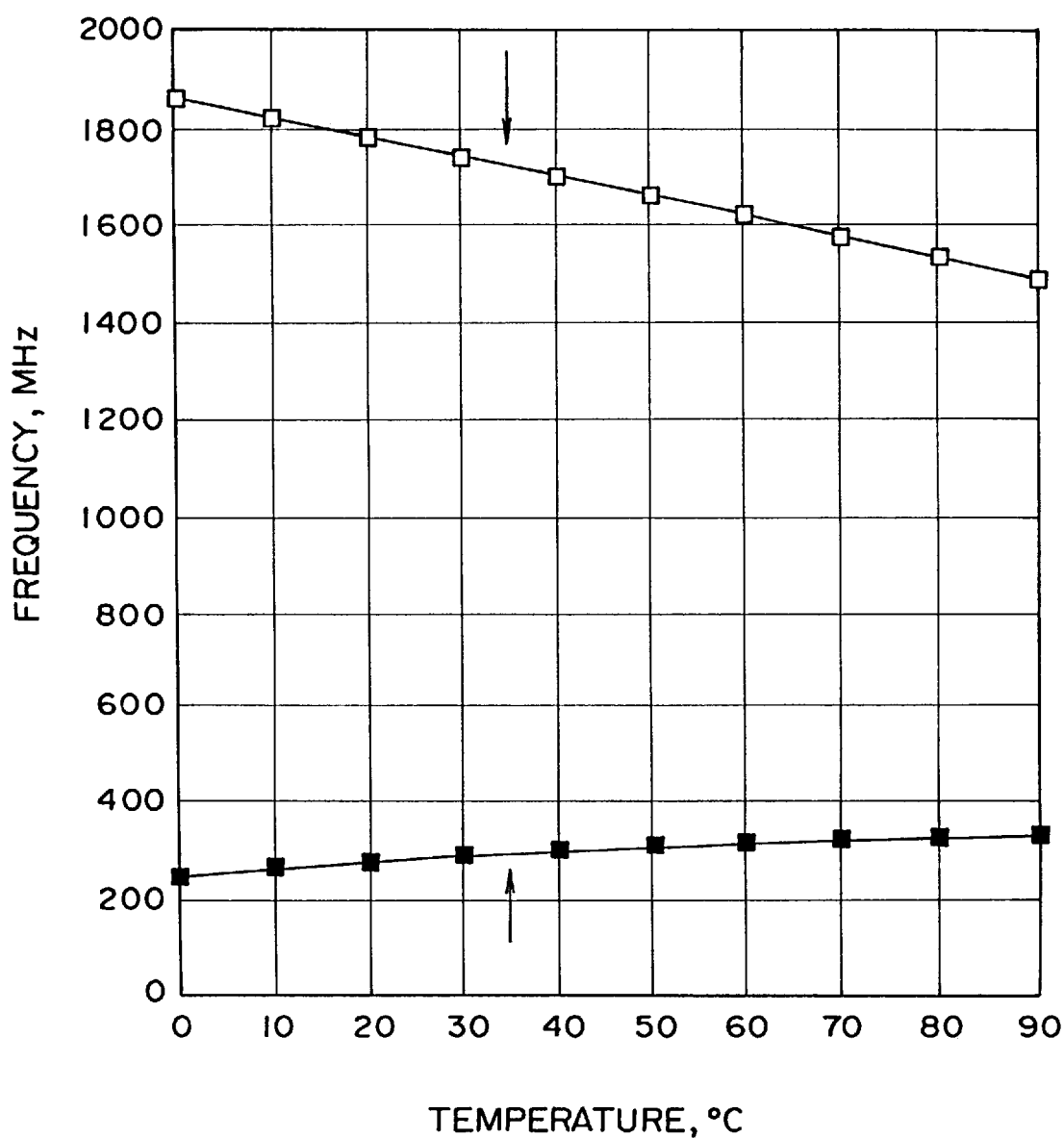
FIG. 2 is a graph showing the frequency range of the MSSWs formed by a thin film of gallium-substituted YIG, of which the principal plane is the (110) plane and the saturation magnetization is 1200 G, in which the angle between the <100> axis and the direction of the magnetic field is 28°, as a function of the temperature.

FIG. 2 shows the frequency range for the existence of MSSWs in a thin film of the same gallium-substituted YIG as in FIG. 1 as a function of temperature from 0° C. to 90° C. assuming about 28° for the angle θ between the direction of the magnetic field and the direction of the crystallographic <100> axis within the (100) plane of the YIG film. As is shown in FIG. 2, the low-pass cut-off frequency can be lower than 400 MHz within a wide temperature range of 0° C. to 90° C.

Figure 10:
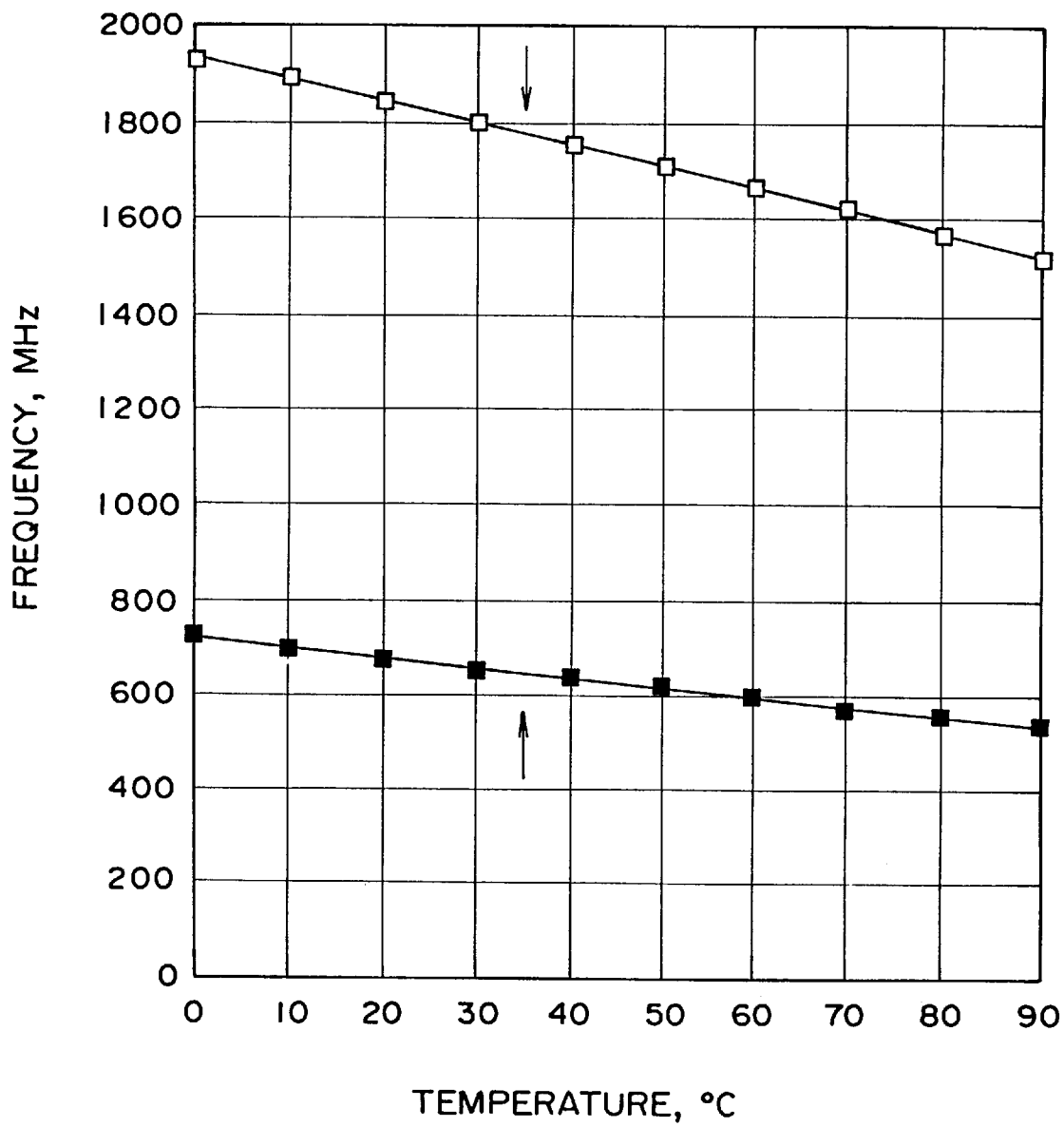

For comparison, measurements were undertaken of the frequency range for the existence of MSSWs in a YIG thin film of θ=144° having a crystallographic orientation of (111) and a saturation magnetization of 1200 G at room temperature within a temperature range from 0° C. to 90° C. to give the results shown in FIG. 10 which indicates that the low-pass cut-off frequency is 400 MHz or higher throughout the temperature range of 0° C. to 90° C.

Figure 3:
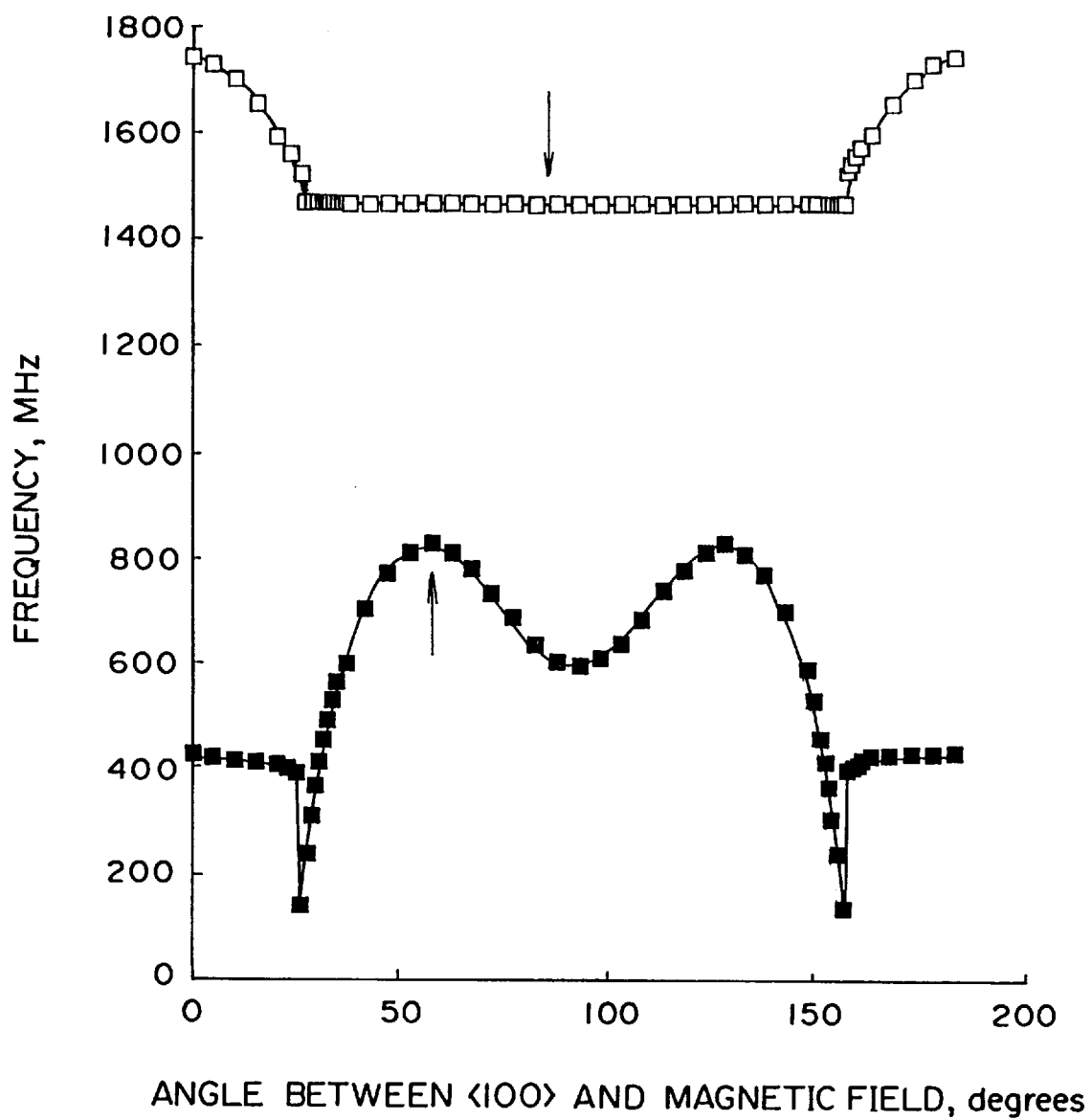
FIGS. 3 and 4 are each a graph showing the frequency range of the MSSWs formed by a thin film of gallium-substituted YIG, of which the principal plane is the (110) plane and the saturation magnetization is 970 G and 720 G, respectively, as a function of the angle between the direction of the <100> axis and the direction of the magnetic field.
Figure 4:
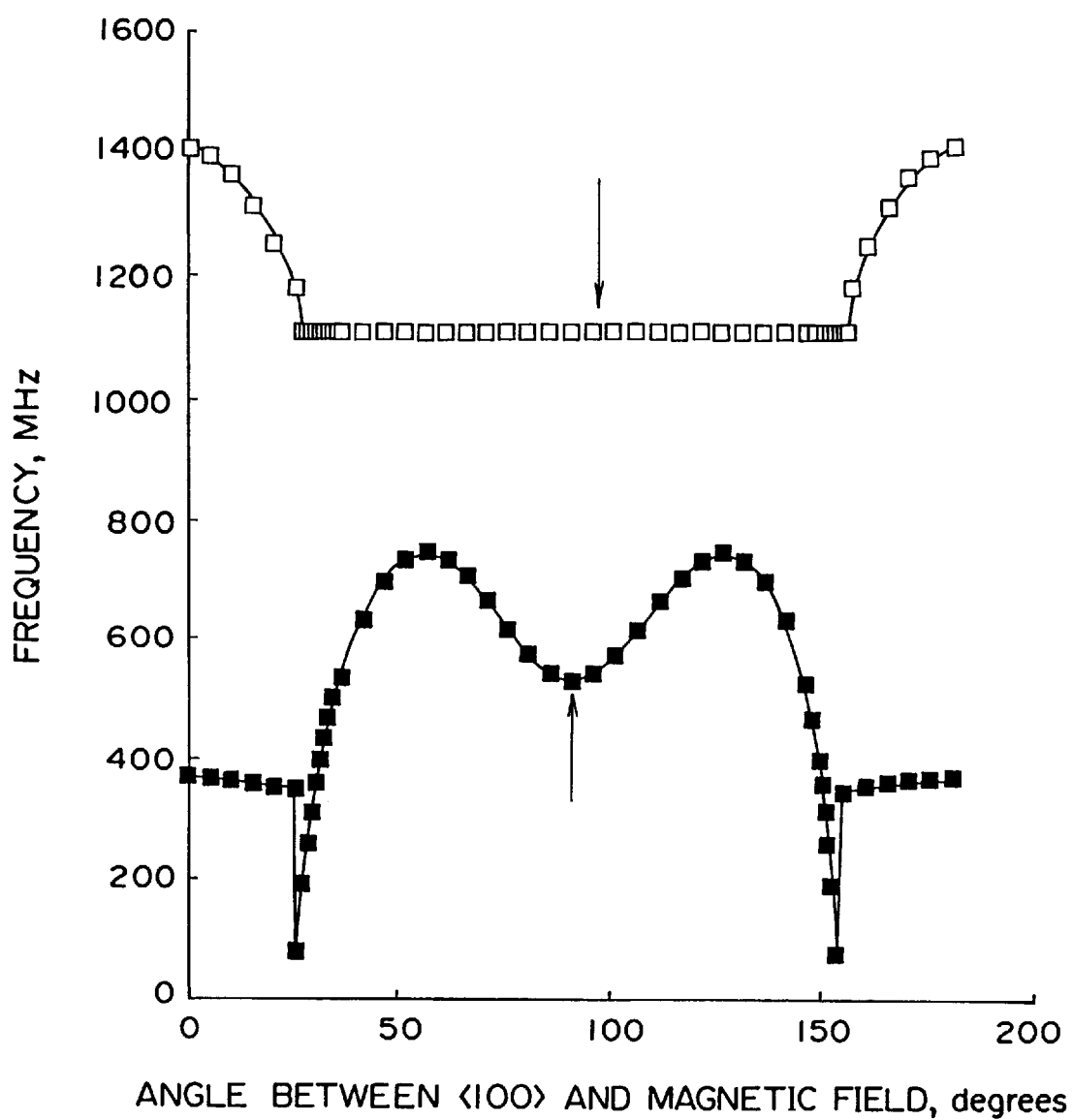

FIGS. 3 and 4 similar to FIG. 1 each show the results obtained by the measurements of the low-pass cut-off frequency and high-pass cut-off frequency conducted in the same manner as for FIG. 1 in thin films of a gallium-substituted YIG of which the principal plane is the (110) plane and the saturation magnetization is 970 G and 720 G, respectively, as a function of the angle θ between the direction of the magnetic field and the direction of the <110> axis. In each of these two cases, dips are found where the low-pass cut-off frequency can be 400 MHz or lower at the angle of about +28° and +152° (=−28°) within the range of ±27° to ±33°. Though not shown by the data, it has been found by calculation that the low-pass cut-off frequency in these dips is 400 MHz or lower over a wide temperature range of 0° C. to 90° C.

Figure 5:
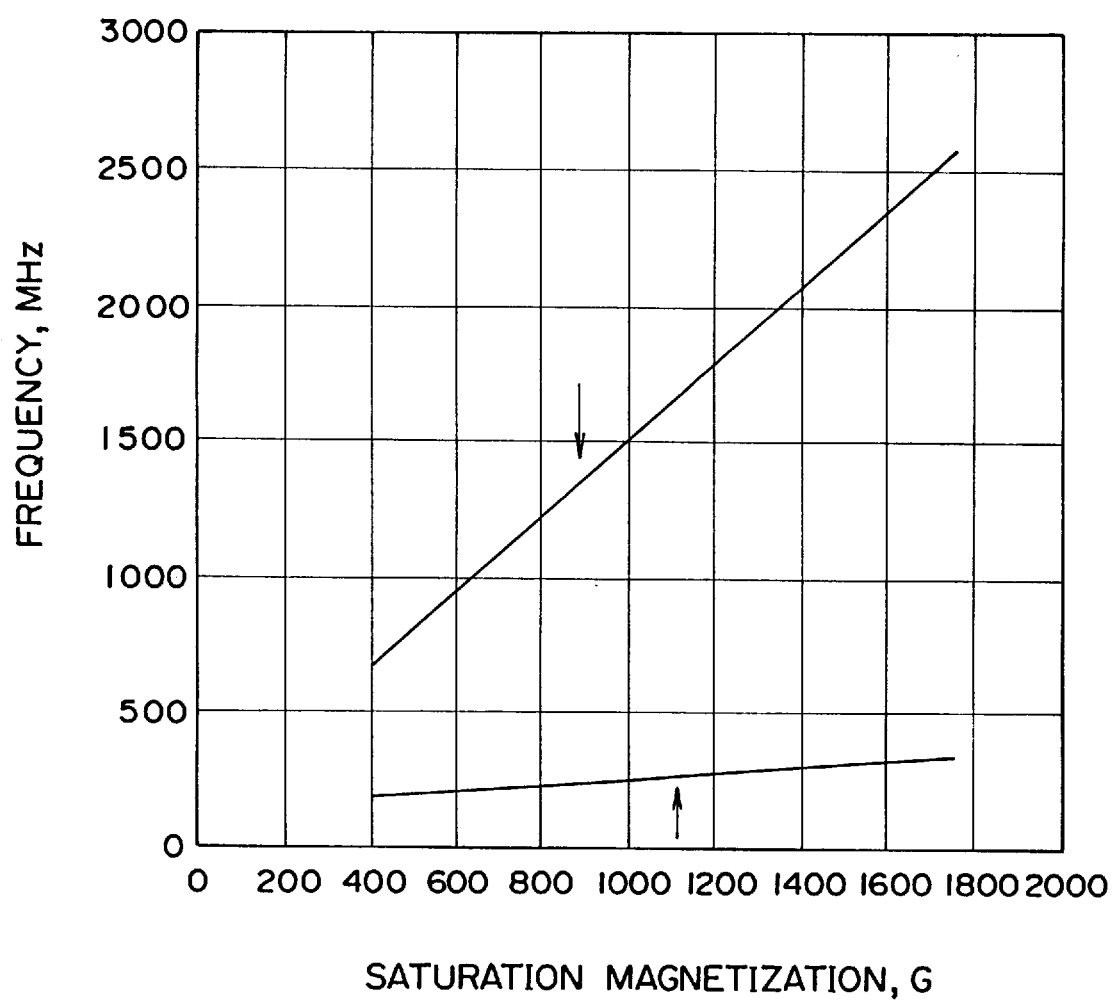
FIG. 5 is a graph showing the frequency range of the MSSWs formed by a thin film of gallium-substituted YIG, of which the principal plane is the (110) plane, in which the angle between the direction of the <100> axis and the direction of the magnetic field is 28°, as a function of the saturation magnetization.

FIG. 5 shows the frequency range for the existence of MSSWs in thin films of gallium-substituted YIG having different saturation magnetizations, of which the principal plane is the (110) plane, when the angle θ between the direction of the magnetic field and the direction of the <100> axis is 28°, as a function of the saturation magnetization. A theoretical consideration has led to a conclusion that the low-pass cut-off frequency of the MSSWs can be 400 MHz or lower in this case even by increasing the saturation magnetization of the YIG thin film as compared with the case shown in FIG. 8 in which the principal plane of the gallium-substituted YIG thin film is the (111) plane so that the MSSW device can work with stability at a frequency of 400 MHz or lower within a wide range of the ambient temperature. These results mean that the working frequency of the MSSW device can be decreased while keeping a wide band range and a small half-value width of magnetic resonance ΔH. This phenomenon is due to the fact that the anisotropic magnetic field HK in the above given equation (1) has a small value not exceeding about −10 G within a wide composition range of the YIG thin films and HK has little temperature dependence when the angle θ between the direction of the magnetic field applied thereto and the direction of the <100> axis within the (110) plane of the garnet thin film is in the range from ±27° to ±33°.

The inventors have also conducted experiments to arrive at a discovery leading to completion of the present invention that the above described problems in an MSSW device in which a magnetic field is applied within the plane of a thin film of a magnetic oxide garnet can be solved when the direction of the magnetic field deviates by an angle in the range from ±27° to ±33° from the direction of the <100> axis within the (110) plane of the magnetic oxide garnet film and, in particular, when the magnetic oxide garnet film is an epitaxial film grown by the liquid-phase epitaxial method on the substrate surface having a crystallographic plane orientation of (110) and has a chemical composition expressed by the formula $R_3(Fe,M)_5O_{12}$, in which R is an element selected from the group consisting of bismuth, yttrium, lanthanum, lutetium and gadolinium and M is an element selected from the group consisting of gallium, aluminum and scandium.

In the following, several embodiments of the present invention are illustrated in more detail by way of examples and comparative examples.

Example 1

An epitaxial YIG-based thin film having a thickness of 50 μm was grown on the surface of a GGG (gadolinium gallium garnet) substrate having a crystallographic orientation of (110) by the liquid-phase epitaxial growth method. The YIG-based epitaxial garnet film had a chemical composition expressed by the formula $La_{0.1}Y_{2.9}Fe_{4.7}Ga_{0.3}O_{12}$ and had a saturation magnetization of 1200 G at room temperature and the half-value width of magnetic resonance ΔH at 9.2 GHz was as small as 0.8 Oe.

Figure 6A:
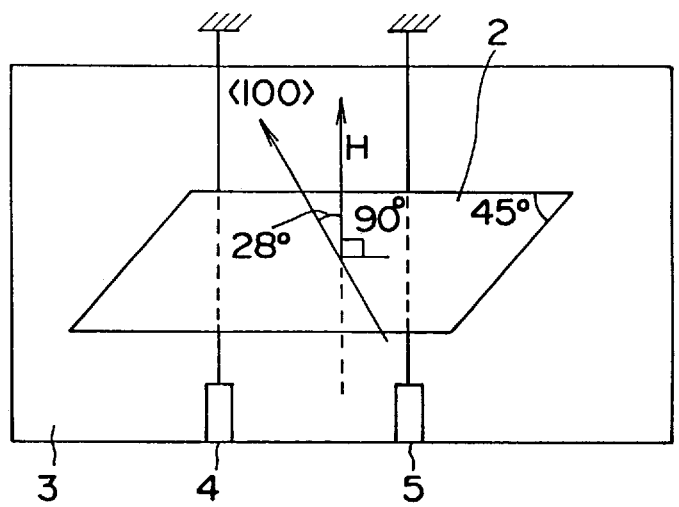
FIGS. 6A and 6B are each a plan view and a side view, respectively, of the MSSW filter prepared in Example 1.
Figure 6B:
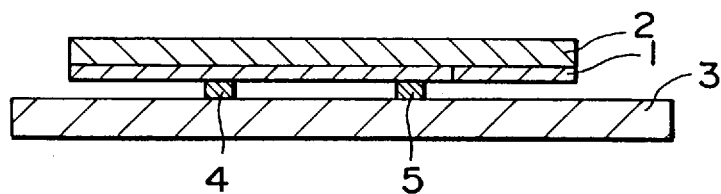

An MSSW filter schematically illustrated in FIGS. 6A and 6B by a plan view and a side view, respectively, was constructed by utilizing the thus prepared epitaxial wafer in the following manner. Thus, the epitaxial film 1 on the GGG substrate 2 was mechanically processed into a chip for a MSSW device having a cut facet perpendicular to the direction deviating by 28° from the direction of the <100> axis. The chip had a general form of an elongated strip of 5 mm width and 20 mm length with the ends as cut at an angle of 45° to be parallelogrammic. The chip was mounted on a ceramic substrate 3 to overlay the input transducer 4 and output transducer 5 thereon and an external magnetic field of 20 G was applied to the chip in the direction indicated by the arrow H in FIG. 6A, which made an angle of 28° with the direction of the <100> axis within the (110) plane.

Figure 7:
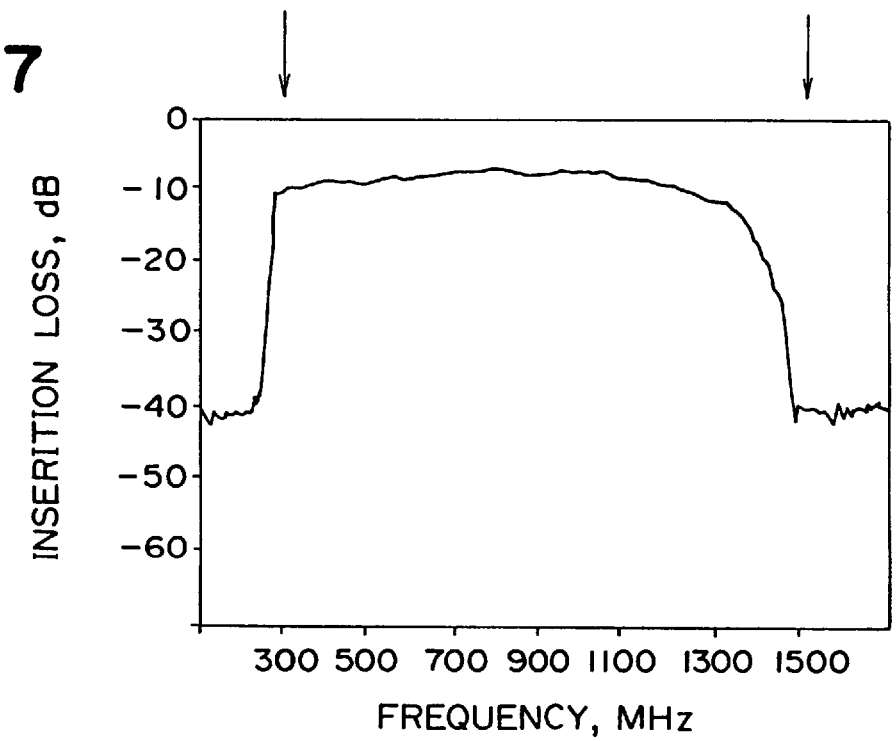
FIG. 7 is a graph showing the insertion loss of the MSSW filter prepared in Example 1 as a function of the frequency.

The MSSW filter was subjected to the measurement of the insertion loss at room temperature as a function of the frequency to give the results shown graphically in FIG. 7, from which it is understood that the low-pass cut-off frequency and the high-pass cut-off frequency are about 300 MHz and about 1500 MHz, respectively, and the insertion loss was about −10 dB within this frequency range. Further, the temperature dependence of the low-pass and high-pass cut-off frequencies was about the same as shown in FIG. 2. These results lead to a conclusion that the MSSW device is useful for an S/N enhancer in the 400 MHz band.

Further MSSW filters were prepared in the same manner as above except that the angle θ between the direction of the magnetic field and the direction of the <100> axis within the (110) plane was varied and they were subjected to the determination of the low-pass and high-pass cut-off frequencies to examine the relationship thereof with the angle θ. The results were that the low-pass cut-off frequency of the MSSWs could be 400 MHz or lower when the angle θ was in the range from 27° to 33° or in the range from 147° to 153°(=−33° to −27°) in a wide temperature range from 0° C. to 90° C. leading to a conclusion that the angle θ could be in the above mentioned ranges.

Example 2

An MSSW filter was prepared in the same manner as in Example 1 except that the YIG-based garnet film epitaxially grown on the surface of a GGG substrate having a crystallographic plane orientation of (110) had a chemical composition expressed by the formula $La_{0.12}Y_{2.88}Fe_{4.5}Ga_{0.5}O_{12}$. The garnet film had a saturation magnetization of 970 G at room temperature and a half-value width of magnetic resonance ΔH of 1.0 Oe at a frequency of 9.2 MHz.

An external magnetic field of 20 G was applied to the chip in such a direction that the angle between the direction of the magnetic field and the direction of the <100> axis within the (110) plane was 28° to find that the low-pass cut-off frequency was as low as about 300 MHz and the high-pass cut-off frequency was as high as about 1460 MHz at room temperature and the low-pass cut-off frequency could always be 400 MHz or lower when the temperature was in the range from 0° C. to 90° C. so as to establish the usefulness thereof as an MSSW device for an S/N enhancer in the 400 MHz band.

Example 3

An MSSW filter was prepared in the same manner as in Example 1 except that the YIG-based garnet film epitaxially grown on the surface of a GGG substrate having a crystallographic plane orientation of (110) had a chemical composition expressed by the formula $La_{0.15}Y_{2.85}Fe_{4.33}Ga_{0.67}O_{12}$. The garnet film had a saturation magnetization of 720 G at room temperature and a half-value width of magnetic resonance ΔH of 1.2 Oe at a frequency of 9.2 MHz.

An external magnetic field of 20 G was applied to the chip in such a direction that the angle between the direction of the magnetic field and the direction of the <100> axis within the (110) plane was 28° to find that the low-pass cut-off frequency was as low as about 250 MHz and the high-pass cut-off frequency was as high as about 1100 MHz at room temperature and the low-pass cut-off frequency could always be 400 MHz or lower when the temperature was in the range from 0° C. to 90° C. so as to establish the usefulness thereof as an MSSW device for an S/N enhancer in the 400 MHz band.

Comparative Example 1

The epitaxial YIG-based thin film grown on the surface of a GGG substrate having a crystallographic orientation of (110) had the same thickness and the same chemical composition as in Example 1. The YIG-based epitaxial garnet film had a saturation magnetization of 1200 G at room temperature and the half-value width of magnetic resonance ΔH at 9.2 GHz was as small as 0.8 Oe.

An MSSW filter similar to that schematically illustrated in FIGS. 6A and 6B by a plan view and a side view, respectively, was constructed by utilizing the thus prepared epitaxial garnet wafer in the following manner. Thus, the epitaxial wafer was mechanically processed into a chip for an MSSW device having a cut facet perpendicular to the direction of the <110> axis. The chip had a general form of an elongated strip of 5 mm width and 20 mm length with the ends as cut at an angle of 45° to be parallelogrammic. The chip was mounted on a ceramic substrate to overlay the input transducer and output transducer thereon and an external magnetic field of 20 G was applied to the chip, which made an angle of 28° with the direction of the <100> axis within the (110) plane. The low-pass and high-pass cut-off frequencies thereof were as high as about 700 MHz and about 1700 MHz, respectively, at room temperature. The temperature dependence of the low-pass and high-pass cut-off frequencies was substantially identical with that shown in FIG. 10 indicating that the low-pass cut-off frequency was always 400 MHz or higher in the temperature range from 0° C. to 90° C. so that the device was found not to be suitable for an S/N enhancer in the 400 MHz band.

Comparative Example 2

The epitaxial YIG-based thin film grown on the surface of a GGG substrate having a crystallographic orientation of (110) had the same thickness and the same chemical composition as in Example 1. The YIG-based epitaxial garnet film had a saturation magnetization of 1200 G at room temperature and the half-value width of magnetic resonance ΔH at 9.2 GHz was as small as 0.8 Oe.

An MSSW filter similar to that schematically illustrated in FIGS. 6A and 6B by a plan view and a side view, respectively, was constructed by utilizing the thus prepared epitaxial garnet wafer in the following manner. Thus, the epitaxial wafer was mechanically processed into a chip for an MSSW device having a cut facet perpendicular to the direction of the <001> axis. The chip had a general form of an elongated strip of 5 mm width and 20 mm length with the ends as cut at an angle of 45° to be parallelogrammic. The low-pass and high-pass cut-off frequencies thereof were as high as about 600 MHz and 1800 MHz, respectively, so that the device was found not to be suitable for an S/N enhancer in the 400 MHz band.

What is claimed is:

1. A magnetostatic surface wave device which comprises a thin film chip of a magnetic oxide garnet, of which the principal plane is the crystallographic (110) plane, having at least one end facet as cut in a plane perpendicular to the direction deviated by an angle in the range from ±27° to ±33° from the direction of the crystallographic <100> axis within the crystallographic (110) plane of the magnetic oxide garnet film.

2. In a magnetostatic surface wave device comprising a thin film chip of a magnetic oxide garnet and means for applying a magnetic field to the thin film chip of the magnetic oxide garnet within the plane of the film, the improvement wherein the magnetic field is applied in a direction such that the angle between the direction of the magnetic field and the direction of the <100> axis of the magnetic oxide garnet within the crystallographic (110) plane thereof is in the range from ±27° to ±33°.

3. In a magnetostatic surface wave device comprising
   (a) a thin film chip of a magnetic oxide garnet which is an epitaxial film grown by the liquid-phase epitaxial growth method on the surface of a substrate having a crystallographic orientation of (110), the magnetic oxide garnet having a chemical composition expressed by the formula $R_3(Fe,M)_5O_{12}$, in which R is an element selected from the group consisting of bismuth, yttrium, lanthanum, lutetium and gadolinium and M is an element selected from the group consisting of gallium, aluminum and scandium; and (b) means for applying a magnetic field to the thin film chip of the magnetic oxide garnet within the plane of the film, the improvement wherein the magnetic field is applied in a direction such that the angle made between the direction of the magnetic field and the direction of the <100> axis of the magnetic oxide garnet within the crystallographic (110) plane thereof is in the range from ±25° to ±33°.

4. The improvement as claimed in claim 3 in which the substrate on which the epitaxial film is grown is gadolinium gallium garnet.

5. The improvement as claimed in claim 3 in which R is a combination of yttrium and lanthanum and M is gallium.

* * * * *